(12) United States Patent
Collins

(10) Patent No.: US 9,055,643 B2
(45) Date of Patent: Jun. 9, 2015

(54) SOLID STATE LIGHTING APPARATUS AND METHODS OF FORMING

(71) Applicant: Cree, Inc., Durham, NC (US)

(72) Inventor: Brian Collins, Holly Springs, NC (US)

(73) Assignee: Cree, Inc., Durham, NC (US)

( * ) Notice: Subject to any disclaimer, the term of this patent is extended or adjusted under 35 U.S.C. 154(b) by 269 days.

(21) Appl. No.: 13/798,721

(22) Filed: Mar. 13, 2013

(65) Prior Publication Data

US 2014/0265921 A1  Sep. 18, 2014

(51) Int. Cl.

| | |
|---|---|
| H01L 29/22 | (2006.01) |
| H05B 37/02 | (2006.01) |
| H05B 33/08 | (2006.01) |
| F21V 19/00 | (2006.01) |
| F21K 99/00 | (2010.01) |
| H01L 25/075 | (2006.01) |
| H01L 33/50 | (2010.01) |

(52) U.S. Cl.
CPC ............ *H05B 33/0842* (2013.01); *F21V 19/00* (2013.01); *F21K 9/56* (2013.01); *H01L 25/0753* (2013.01); *H01L 33/50* (2013.01); *H01L 33/504* (2013.01)

(58) Field of Classification Search
USPC ......... 315/291, 307, 308, 312; 257/76–79, 98
See application file for complete search history.

(56) References Cited

U.S. PATENT DOCUMENTS

| | | |
|---|---|---|
| 4,918,497 A | 4/1990 | Edmond |
| 4,966,862 A | 10/1990 | Edmond |
| 5,027,168 A | 6/1991 | Edmond |
| 5,210,051 A | 5/1993 | Carter, Jr. |
| 5,338,944 A | 8/1994 | Edmond et al. |
| 5,393,993 A | 2/1995 | Edmond et al. |
| 5,416,342 A | 5/1995 | Edmond et al. |
| 5,523,589 A | 6/1996 | Edmond et al. |
| 5,604,135 A | 2/1997 | Edmond et al. |
| 5,631,190 A | 5/1997 | Negley |
| 5,739,554 A | 4/1998 | Edmond et al. |
| 5,912,477 A | 6/1999 | Negley |
| 6,120,600 A | 9/2000 | Edmond et al. |
| 6,187,606 B1 | 2/2001 | Edmond et al. |
| 6,201,262 B1 | 3/2001 | Edmond et al. |
| 7,061,024 B2 * | 6/2006 | Schmidt et al. ................. 257/98 |
| 7,213,940 B1 | 5/2007 | Van de Ven et al. |
| 7,326,583 B2 | 2/2008 | Andrews et al. |
| 7,442,564 B2 | 10/2008 | Andrews |
| 7,521,728 B2 | 4/2009 | Andrews |
| 7,646,035 B2 | 1/2010 | Loh et al. |
| 2002/0123164 A1 | 9/2002 | Slater, Jr. et al. |
| 2003/0006418 A1 | 1/2003 | Emerson et al. |
| 2004/0056260 A1 | 3/2004 | Slater, Jr. et al. |

* cited by examiner

*Primary Examiner* — Jimmy Vu
(74) *Attorney, Agent, or Firm* — Myers Bigel Sibley & Sajovec, P.A.

(57) ABSTRACT

A light emitting device can include a solid state lighting source and a luminophoric medium for down-converting at least some of the radiation emitted by the solid state lighting source. The luminophoric medium may include a first material that down-converts the radiation emitted by the solid state lighting source to radiation having a first peak wavelength and that has a first decay time. The luminophoric medium may include a second material that down-converts the radiation emitted by the solid state lighting source to radiation having a second peak wavelength and that has a second decay time that is longer than the first decay time.

41 Claims, 7 Drawing Sheets

SOLID STATE LIGHTING APPARATUS AND METHODS OF FORMING

FIELD

The present inventive subject matter relates to lighting apparatus and methods and, more particularly, to solid state lighting apparatus and methods of forming.

BACKGROUND

Solid state lighting arrays are used for a number of lighting applications. For example, solid state lighting panels including arrays of solid state light emitting devices have been used as direct illumination sources, for example, in architectural and/or accent lighting. A solid state light emitting device may include, for example, a packaged light emitting device including one or more light emitting diodes (LEDs), which may include inorganic LEDs, which may include semiconductor layers forming p-n junctions and/or organic LEDs (OLEDs), which may include organic light emission layers.

Solid state lighting arrays are used for a number of lighting applications. For example, solid state lighting panels including arrays of solid state light emitting devices have been used as direct illumination sources, for example, in architectural and/or accent lighting. A solid state light emitting device may include, for example, a packaged light emitting device including one or more light emitting diodes (LEDs). Inorganic LEDs typically include semiconductor layers forming p-n junctions. Organic LEDs (OLEDs), which include organic light emission layers, are another type of solid state light emitting device. Typically, a solid state light emitting device generates light through the recombination of electronic carriers, i.e. electrons and holes, in a light emitting layer or region.

LEDs typically have a narrow wavelength distribution that is tightly centered about a "peak" wavelength (i.e., the single wavelength where the radiometric emission spectrum of the LED reaches its maximum as detected by a photo-detector). For example, the spectral power distributions of a typical LED may have a full width of, for example, about 10-30 nm, where the width is measured at half the maximum illumination (referred to as the full width half maximum or "FWHM" width). Accordingly, LEDs are often identified by their "peak" wavelength or, alternatively, by their "dominant" wavelength. The dominant wavelength of an LED is the wavelength of monochromatic light that has the same apparent color as the light emitted by the LED as perceived by the human eye. Thus, the dominant wavelength differs from the peak wavelength in that the dominant wavelength takes into account the sensitivity of the human eye to different wavelengths of light.

As most LEDs are almost monochromatic light sources that appear to emit light having a single color, LED lamps that include multiple LEDs that emit light of different colors have been used in order to provide solid state light emitting devices that generate white light. In these devices, the different colors of light emitted by the individual LED chips combine to produce a desired intensity and/or color of white light. For example, by simultaneously energizing red, green and blue light emitting LEDs, the resulting combined light may appear white, or nearly white, depending on the relative intensities of the source red, green and blue LEDs.

White light may also be produced by surrounding a single-color LED with a luminescent material that converts some of the light emitted by the LED to light of other colors. The combination of the light emitted by the single-color LED that passes through the wavelength conversion material along with the light of different colors that is emitted by the wavelength conversion material may produce a white or near-white light. For example, a single blue-emitting LED chip (e.g., made of indium gallium nitride and/or gallium nitride) may be used in combination with a yellow phosphor, polymer or dye such as for example, cerium-doped yttrium aluminum garnet (which has the chemical formula $Y_3Al_5O_{12}$:Ce, and is commonly referred to as YAG:Ce), that "down-converts" the wavelength of some of the blue light emitted by the LED, changing its color to yellow. Blue LEDs made from indium gallium nitride exhibit high efficiency (e.g., external quantum efficiency as high as 60%). In a blue LED/yellow phosphor lamp, the blue LED chip produces an emission with a dominant wavelength of about 450-460 nanometers, and the phosphor produces yellow fluorescence with a peak wavelength of about 550 nanometers in response to the blue emission. Some of the blue light passes through the phosphor (and/or between the phosphor particles) without being down-converted, while a substantial portion of the light is absorbed by the phosphor, which becomes excited and emits yellow light (i.e., the blue light is down-converted to yellow light). The combination of blue light and yellow light may appear white to an observer. Such light is typically perceived as being cool white in color. In another approach, light from a violet or ultraviolet emitting LED may be converted to white light by surrounding the LED with multicolor phosphors or dyes. In either case, red-emitting phosphor particles (e.g., a CaAlSiN3 ("CASN") based phosphor) may also be added to improve the color rendering properties of the light, i.e., to make the light appear more "warm," particularly when the single color LED emits blue or ultraviolet light.

As noted above, phosphors are one known class of luminescent materials. A phosphor may refer to any material that absorbs light at one wavelength and re-emits light at a different wavelength in the visible spectrum, regardless of the delay between absorption and re-emission and regardless of the wavelengths involved. Accordingly, the term "phosphor" may be used herein to refer to materials that are sometimes called fluorescent and/or phosphorescent. In general, phosphors may absorb light having first wavelengths and re-emit light having second wavelengths that are different from the first wavelengths. For example, "down-conversion" phosphors may absorb light having shorter wavelengths and re-emit light having longer wavelengths.

LEDs are used in a host of applications including, for example, backlighting for liquid crystal displays, indicator lights, automotive headlights, flashlights, specialty lighting applications and even as replacements for conventional incandescent and/or fluorescent lighting in general lighting and illumination applications.

The perceived color of such devices may be a result of the combined emissions of LEDs and one or more phosphors that down-convert light from one or more of the LEDs. The color of the combined emissions may be adjusted by varying the duty cycle of LEDs that are operable, in combination with different respective phosphors, to emit radiation having different dominant wavelengths. However, depending on the length of the on-state corresponding to the duty cycle, the combined emissions may change based on transient characteristics of the phosphors. For example, the decay time of luminescence of a phosphor may correspond to the radiative transition rate from a fluorescent level to a ground state or some low energy state that may be considered a ground state. Such change may result in perceived flickering of the solid state light source.

SUMMARY

Some embodiments of the present disclosure include light emitting devices. Such devices may include a solid state lighting source and a luminophoric medium for down-converting at least some of the radiation emitted by the solid state lighting source. The luminophoric medium may include a first material that down-converts the radiation emitted by the solid state lighting source to radiation having a first peak wavelength and that has a first decay time and a second material that down-converts the radiation emitted by the solid state lighting source to radiation having a second peak wavelength and that has a second decay time that is longer than the first decay time.

In some embodiments, the first peak wavelength is substantially the same as the second peak wavelength. Some embodiments provide that the first peak wavelength is different than the second peak wavelength.

Some embodiments include a first solid state lighting source and a second solid state lighting source. In such embodiments, the first material may down-convert radiation from the first solid state lighting source and the second material may down-convert radiation from the second solid state lighting source. Some embodiments provide that the first peak wavelength is substantially the same as the second peak wavelength. In some embodiments, the first peak wavelength is different that the second peak wavelength.

Some embodiments provide that the device includes a first solid state lighting source, a second solid state lighting source, a third solid state lighting source, and a fourth solid state lighting source. The first material may down-convert radiation from the first solid state lighting source and the second material may down-convert radiation from the second solid state lighting source. The luminophoric medium may include a third material that down-converts radiation emitted by the third solid state lighting source to radiation having a third peak wavelength and that has a third decay time and a fourth material that down-converts radiation emitted by the fourth solid state lighting source to radiation having a fourth peak wavelength and that has a fourth decay time.

In some embodiments, the first wavelength is substantially the same as the second wavelength, the third wavelength is substantially the same as the fourth wavelength, the first decay time is different that the second decay time, and the third decay time is different that the fourth decay time.

Some embodiments provide that the first wavelength is substantially the same as the second wavelength, the third wavelength is substantially the same as the fourth wavelength, the first decay time is different that the second decay time, and the third decay time is substantially the same as the fourth decay time.

Some embodiments provide that the solid state lighting source includes a first solid state lighting source and the device further includes a second solid state lighting source. Some embodiments further include a first driver circuit that is operable to provide current to the first solid state lighting source at a first duty cycle that defines a ratio of on-state time to off-state time of the first solid state lighting source and a second driver circuit that is operable to provide current to the second solid state lighting source at a second duty cycle that defines a ratio of on-state time to off-state time of the second solid state lighting source. In some embodiments, the first material down-converts radiation from the first solid state lighting source and the second material down-converts radiation from the second solid state lighting source.

In some embodiments, a ratio of the first decay time to the second decay time is positively correlated with a ratio of the first duty cycle to the second duty cycle. Some embodiments provide that the first duty cycle is less than the second duty cycle and the first decay time is less than the second decay time.

A device according to some embodiments includes an alternating current (AC) voltage source input, from outside the solid state lighting device and a rectifier circuit coupled to the AC voltage source input to provide a rectified AC voltage to the first driver circuit and the second driver circuit.

In some embodiments, the first peak wavelength and/or the second peak wavelength is in a range of about 535 nm to about 565 nm. Some embodiments provide that first peak wavelength and/or the second peak wavelength is in a range of about 535 nm to about 545 nm. In some embodiments, the first peak wavelength and/or the second peak wavelength is in a range of about 545 nm to about 565 nm. Some embodiments provide that the first peak wavelength and/or the second peak wavelength is in a range of about 630 nm to about 650 nm.

Some embodiments provide that the first decay time is in a range of about 0.08 μseconds to about 0.12 μseconds. In some embodiments, the second decay time is in a range of about 0.18 μseconds to about 0.22 μseconds. Some embodiments provide that the first decay time is in a range of about 18 μseconds to about 22 μseconds. In some embodiments, the second decay time is in a range of about 28 μseconds to about 32 μseconds.

Some embodiments of the present disclosure are directed to methods of providing a solid state lighting device. Some embodiments of such methods include mounting, to a substrate, a first portion of multiple solid state lighting sources that include a first luminophoric material that down-converts radiation emitted by the first portion of solid state lighting sources to radiation having a first wavelength and that has a first decay time, and mounting, to the substrate, a second portion of the solid state lighting devices having a second luminophoric material that down-converts radiation emitted by the second portion of the solid state lighting sources to radiation having a second peak wavelength and that has a second decay time that is longer than the first decay time.

In some embodiments, the first peak wavelength is substantially the same as the second peak wavelength. Some embodiments provide that the first peak wavelength is different than the second peak wavelength.

Some embodiments further include providing a first driver circuit that is operable to provide current to the first portion of the solid state lighting sources at a first duty cycle that defines a ratio of on-state time to off-state time of the first portion of the solid state lighting sources and providing a second driver circuit that is operable to provide current to the second portion of the solid state lighting sources at a second duty cycle that defines a ratio of on-state time to off-state time of the second portion of the solid state lighting sources.

In some embodiments, a ratio of the first decay time to the second decay time is positively correlated with a ratio of the first duty cycle to the second duty cycle. Some embodiments provide that the first duty cycle is less than the second duty cycle and the first decay time is less than the second decay time.

Some embodiments further include providing an alternating current (AC) voltage source input, from outside the solid state lighting device and providing a rectifier circuit coupled to the AC voltage source input to provide a rectified AC voltage to the first driver circuit and the second driver circuit.

Some embodiments of the present disclosure are directed to methods for providing a solid state lighting device that includes multiple solid state lighting sources. The solid state lighting sources include a first portion of solid state lighting sources having a first luminophoric material and that are configured to be driven at a first duty cycle and a second portion of the solid state lighting sources having a second luminophoric material and that are configured to be driven at a second duty cycle that is different from the first duty cycle. Embodiments of the method may include selecting the first portion of the solid state lighting sources based on a first decay time of the first luminophoric material and selecting the second portion of the solid state lighting sources based on a second decay time of the second luminophoric material.

In some embodiments, the second decay time is longer than the first decay time and the second duty cycle is greater than the first duty cycle. Some embodiments provide that a ratio of the first duty cycle to the first decay time is about a given percentage of a ratio of the second duty cycle to the second decay time. In some embodiments, the given percentage is in a range of about 50 percent to about 150 percent. Some embodiments provide that the given percentage is in a range of about 80 percent to about 120 percent. Some embodiments provide that the given percentage is in a range of about 90 percent to about 110 percent.

It is noted that aspects of the inventive concepts described with respect to one embodiment may be incorporated in a different embodiment although not specifically described relative thereto. That is, all embodiments and/or features of any embodiments can be combined in any way and/or combination. These and other objects and/or aspects of the present inventive concepts are explained in detail in the specification set forth below

DETAILED DESCRIPTION

Figure 1:
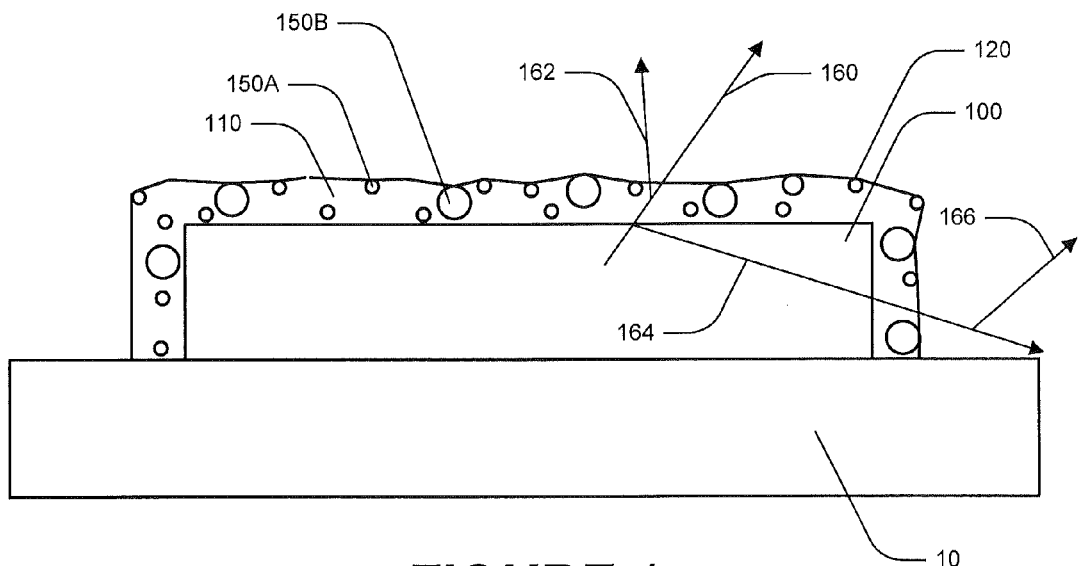
FIG. 1 is a schematic side cross-sectional view illustrating a semiconductor device including a phosphor particle containing layer and circulating light conversion of light emitted therefrom according to some embodiments of the present invention.

Embodiments of the present inventive subject matter now will be described more fully hereinafter with reference to the accompanying drawings, in which embodiments of the present inventive subject matter are shown. This present inventive subject matter may, however, be embodied in many different forms and should not be construed as limited to the embodiments set forth herein. Rather, these embodiments are provided so that this disclosure will be thorough and complete, and will fully convey the scope of the present inventive subject matter to those skilled in the art. Like numbers refer to like elements throughout.

The expression "lighting apparatus", as used herein, is not limited, except that it indicates that the device is capable of emitting light. That is, a lighting apparatus can be a device which illuminates an area or volume, e.g., a structure, a swimming pool or spa, a room, a warehouse, an indicator, a road, a parking lot, a vehicle, signage, e.g., road signs, a billboard, a ship, a toy, a mirror, a vessel, an electronic device, a boat, an aircraft, a stadium, a computer, a remote audio device, a remote video device, a cell phone, a tree, a window, an LCD display, a cave, a tunnel, a yard, a lamppost, or a device or array of devices that illuminate an enclosure, or a device that is used for edge or back-lighting (e.g., back light poster, signage, LCD displays), bulb replacements (e.g., for replacing alternating current (AC) incandescent lights, low voltage lights, fluorescent lights, etc.), lights used for outdoor lighting, lights used for security lighting, lights used for exterior residential lighting (wall mounts, post/column mounts), ceiling fixtures/wall sconces, under cabinet lighting, lamps (floor and/or table and/or desk), landscape lighting, track lighting, task lighting, specialty lighting, ceiling fan lighting, archival/art display lighting, high vibration/impact lighting, work lights, etc., mirrors/vanity lighting, or any other light emitting device.

The present inventive subject matter further relates to an illuminated enclosure (the volume of which can be illuminated uniformly or non-uniformly), comprising an enclosed space and at least one lighting apparatus according to the present inventive subject matter, wherein the lighting apparatus illuminates at least a portion of the enclosed space (uniformly or non-uniformly).

Some embodiments of the present invention relate to application of an optical material to an optical element that is mounted on a substrate. The optical element may include a semiconductor light emitting device.

Various embodiments of the present invention for manufacturing and/or packaging a light emitter such as a semiconductor light emitting device will be described herein. As used herein, the term semiconductor light emitting device may include a light emitting diode (LED), laser diode and/or other semiconductor device which includes one or more semiconductor layers, which may include silicon, silicon carbide, gallium nitride and/or other semiconductor materials, a substrate which may include sapphire, silicon, silicon carbide and/or other microelectronic substrates, and one or more contact layers which may include metal and/or other conductive layers. In some embodiments, ultraviolet, blue and/or green light emitting diodes may be provided. Red and/or amber LEDs may also be provided. The design and fabrication of semiconductor light emitting devices are well known to those having skill in the art and need not be described in detail herein.

For example, the semiconductor light emitting device may be gallium nitride-based LEDs or lasers fabricated on a silicon carbide substrate such as those devices manufactured and sold by Cree, Inc. of Durham, N.C. The present invention may be suitable for use with LEDs and/or lasers as described in U.S. Pat. Nos. 6,201,262; 6,187,606; 6,120,600; 5,912,477; 5,739,554; 5,631,190; 5,604,135; 5,523,589; 5,416,342; 5,393,993; 5,338,944; 5,210,051; 5,027,168; 5,027,168; 4,966,862 and/or 4,918,497, the disclosures of which are incorporated herein by reference as if set forth fully herein. Other suitable LEDs and/or lasers are described in published U.S. Patent Publication No. US 2003/0006418 A1 entitled Group III Nitride Based Light Emitting Diode Structures With a Quantum Well and Superlattice, Group III Nitride Based Quantum Well Structures and Group III Nitride Based Superlattice Structures, published Jan. 9, 2003, as well as published U.S. Patent Publication No. US 2002/0123164 A1 entitled Light Emitting Diodes Including Modifications for Light Extraction and Manufacturing Methods Therefor. Furthermore, phosphor coated LEDs, such as those described in U.S. Patent Publication No. 2004/0056260 A1, entitled Phosphor-Coated Light Emitting Diodes Including Tapered Sidewalls and Fabrication Methods Therefor, the disclosure of which is incorporated by reference herein as if set forth fully, may also be suitable for use in embodiments of the present invention. The LEDs and/or lasers may be configured to operate such that light emission occurs through the substrate. In such embodiments, the substrate may be patterned so as to enhance light output of the devices as is described, for example, in the above-cited U.S. Patent Publication No. US 2002/0123164 A1. Furthermore, the present invention may be suitable for use with light emitting devices and methods therefore, such as those described in U.S. Pat. Nos. 7,326,583, 7,442,564, 7,521,728 and 7,646,035, the disclosures of which are incorporated by reference as if set forth fully herein.

Optical materials may include wavelength converting materials, luminescent materials, scattering particles, and/or light filters, among others. Particles as discussed herein may include small and/or large diameter particles. For example, some embodiments provide that small particles can be about 5 microns or less mean diameter particle size and can include nanoparticles. Large diameter particles can include about 15 microns or greater mean diameter size, such as, for example, 17 microns or greater.

Particles, such as phosphor particles, may be included and/or suspended in a coating that may be conformally applied to and/or deposited on a semiconductor device such as, for example, an LED chip. In some embodiments, the coating may be applied by spraying, dipping and/or by a mechanical application device including a brush, roll and/or stamp, among others.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of this specification and the relevant art and will not be interpreted in an idealized or overly formal sense unless expressly so defined herein.

According to some embodiments of the present invention, luminescent particles provided may include luminescent nitride particles and may be useful as phosphors. The term "luminescent particle" is used herein to describe phosphor particles made from host materials including oxides, nitrides, oxynitrides, sulfides, selenides, halides and/or silicates of zinc, cadmium, manganese, aluminum, silicon, and/or various rare earth metals. For example, phosphors may include Ce-doped YAG (YAG:$Ce^{3+}$, or $Y_3Al_5O_{12}$:$Ce^{3+}$), Ba, Ca, Sr orthosilicate, and/or TAG:Ce among others. The term "luminescent nitride particle" is used herein to describe particles including phosphors for which the anion is predominantly nitride and in which the amount of oxygen present in the crystal structure is so minimal as to avoid changing the crystal structure from that fundamentally formed by the nitride.

The luminescent particles may include a host compound material and an activator material that is combined with the host compound material in a determined quantity. Stated differently the host compound may be doped with the activator material. Some embodiments provide that the host compound includes $Ca_{1-x}Sr_xAlSiN_3$, $Ca_2Si_5N_8$, $Sr_2Si_5N_8$, $Ba_2Si_5N_8$, $BaSi_7N_{10}$, $BaYSi_4N_7$, $Y_5(SiO_4)_3N$, $Y_4Si_2O_7N_2$, $YSiO_2N$, $Y_2Si_3O_3N_4$, $Y_2Si_3$-$xAlxO_3$+$xN_4$-x, $Ca_{1.5}Si_9Al_3N_{16}$, $Y_{0.5}Si_9Al_3O_{1.5}N_{14.5}$, $CaSiN_2$, $Y_2Si_4N_6C$, and/or $Y_6Si_{11}N_{20}O$, among others. In some embodiments, the activator material includes at least one of Ce, Eu, Sm, Yb, Gd and/or Tb, among others.

Reference is now made to FIG. 1, which is a schematic side cross-sectional view illustrating a semiconductor device including a phosphor particle containing layer and circulating light conversion of light emitted therefrom according to some embodiments of the present invention. Some embodiments provide that a light emitter 100 may be mounted to and/or otherwise attached to a submount 10. The light emitter 100 may be conformally coated with a luminophoric medium 120 light emitter 100 is operable to emit light 160.

The luminophoric medium 120 may include an encapsulant 110 that may provide support for the luminescent particles 150A, 150B. For example, the luminescent particles 150A, 150B may be dispersed and/or suspended in a silicone encapsulant 110.

A portion of the light 160 may pass through luminophoric medium 120. A converted portion of light 162 may result from the light conversion properties of the luminophoric medium 120. Some embodiments provide that a portion of the emitter generated light is reflected internally, which may result in circulating light 164.

As illustrated in FIG. 1, the luminophoric medium 120 may include multiple different luminescent particles 150A, 150B. Although illustrated as including different size particles, such representation is just for the purposes of illustration may not be representative of embodiments herein. As discussed above, the luminophoric medium 120 may be operative to down-convert at least some of the radiation emitted by the light emitter 100.

Some embodiments provide that the different luminescent particles 150A, 150B in the luminophoric medium 120 include, respectively a first material and a second material. The first material may down-convert the radiation emitted by the light emitter 100 to radiation having a different peak wavelength than the light emitted from the emitter 100 and may have a first decay time. The second material may down-convert the radiation emitted by the light emitter 100 to radiation having a different peak wavelength than the light emitted from the light emitter 100 and may have a second decay time that is longer than the first decay time. Thus, the first luminescent particles 150A may have a different decay time than the second luminescent particles 150B.

The decay time may refer to the amount of time that a luminescent particle 150A, 150B continues to emit light after light ceases to be received by the luminescent particle 150A, 150B. Decay time may be referred to as persistence in that a luminescent particle having a longer decay time may be considered to have a greater persistence. Although previous developments may have focused on decreasing the persistence of luminescent particles, as realized herein, materials having different persistence properties may be advantageously used in combination therewith.

Some embodiments provide that decay time, or persistence, may be affected during the manufacturing of luminescent materials. For example, decay times may be increased by purposely introducing defects or traps in the crystalline structure of a luminescent material. In some embodiments, such defects may be introduced by adding one or more dopants and/or by a heating operation. For example, in the case of a nitride phosphor, the introduction of a small dopant may increase decay time. Some embodiments provide that a YAG based phosphor, such as, for example, $Y_{3-x}^{3+}Ce_x^{3+}Al_5O_2$ may be heated to introduce decay time increasing defects.

In some embodiments, light emissions from the first and second luminescent particles 150A, 150B may have the same peak wavelength as one another or may have different peak wavelengths. For example, some embodiments provide that the first luminescent particle 150A emits light having a first peak wavelength and has the first decay time while the second luminescent particle 150B emits light having a second peak wavelength that is different from the first peak wavelength and that has the second decay time that is longer than the first decay time. In such embodiments, the persistence of the color corresponding to the light from the second luminescent particle 150B may be greater than the color corresponding to the light from the first luminescent particle 150A. In some embodiments, luminescent particle decay times may be used to address and/or partially address perception differences corresponding to the spectra of luminance perception of an observer. For example, different sensor elements may have different sensitivities to different wavelengths of light.

Some embodiments provide that the first and second luminescent particles 150A and 150B may correspond to different duty cycles of operation of the light emitter 100. In some embodiments, the decay times and duty cycle may be positively correlated. For example, a light emitter 100 that is fired for a longer time period each cycle (i.e., a greater duty cycle) may be used in conjunction with luminescent particles 150B having a longer decay time. In some embodiments, the decay times and duty cycle may be negatively correlated. For example, a light emitter 100 that is fired for a longer time period each cycle (i.e., a greater duty cycle) may be used in conjunction with luminescent particles 150A having a shorter decay time.

In some embodiments, the light emitter 100 may be configured to emit radiation having an emission peak wavelength in a range of about 365 nm to about 420 nm, which corresponds to a ultra-violet (UV) to violet color range. Luminophoric media 120 may include one or more first luminescent particles 150 that may down-convert the radiation emitted by the light emitter 100 to radiation having a first peak wavelength and one or more second luminescent particles 150 that may down-convert the radiation emitted from the light emitter 100 to radiation having a second peak wavelength.

In some embodiments, the first and second luminescent particles 150 have similar decay times. Some embodiments provide that the combined emission from the first and second luminescent particles 150 is a substantially white light and the emission from the light emitter 100 is substantially in a non-visible portion of the spectrum. As such, a color corresponding to the combined emission of the device when the light emitter 100 is in an on-state may be substantially the same as when the light emitter 100 is in an off-state while the first and second luminescent particles 150 continue to emit during the persistent emission that occurs during the decay time.

Some embodiments further include a third luminescent particle 150 that emits light having a third peak wavelength and has the third decay time may be configured. The third wavelength may be different from the first and second wavelengths and third decay time may be substantially similar to the first and second decay times. In this regard, a color corresponding to the combined emission of the device when the light emitter 100 is in an on-state may be substantially the same as when the light emitter 100 is in an off-state while the first, second and third luminescent particles 150 continue to emit during the persistent emission that occurs during the decay time. Some embodiments provide that the combined emission from the first, second and third luminescent particles 150 is a substantially white light.

Additionally, some embodiments provide that fourth, fifth and sixth luminescent particles 150 that emit light having first, second and third wavelengths, respectively, have fourth, fifth and sixth decay times that are different from the first, second and third decay times, respectively. In this manner, luminescent particles 150 having different decay times but having substantially the same wavelength emission characteristics may be provided.

In some embodiments, the first, second and third luminescent particles 150 may correspond to ones of blue-emitting, blue/green-emitting, yellow/green-emitting, and/or red-emitting phosphors. Non-limiting examples of blue-emitting phosphors include: (Ca, Sr)5(PO4)3Cl:Eu2+; BaMgAl10O17:Eu2+; and/or (Sr, Ba)(3MgSi2O8:Eu2+, among others. A non-limiting example of a blue/green emitting phosphor may include BaMgAl10O17:Eu2+, Mn2+, among others. A non-limiting example of a yellow/green emitting phosphor may include Zn2GeO4:Mn2+, among others. Non-limiting examples of red-emitting phosphors may include: Y2O2S:Eu3+; Gd2O2S:Eu3+; La2O2S:Eu3+; Ba3MgSiO2O8:Eu2+, Mn2+; and/or LiEuW2O8 (Eu3+), among others.

Some embodiments provide that the solid state light emitting device includes an LED that is configured to emit radiation having the emission peak wavelength corresponding to ultra-violet light. The first material may include a first phosphor emitting the first peak wavelength of light in a range of about 475 nm to about 510 nm. The second material may include a second phosphor emitting the second peak wavelength of light in a range of about 520 nm to about 570 nm. Some embodiments provide that a third material may include a third phosphor emitting the third peak wavelength of light in a range of about 630 nm to about 650 nm.

In some embodiments, the luminophoric medium includes a layer that is positioned to be in a path of the radiation emitted by the light emitter 100 and that includes the first material, the second material and the third material in the layer. Some embodiments provide that the luminophoric medium includes a first layer that includes one or two of the first, second or third materials; a second layer that includes one or two of the first second or third materials and a third layer that includes one or two of the first, second or third materials.

In some embodiments, the first decay time is greater than about 0.001 seconds. Some embodiments provide that the second decay time is greater than about 0.001 seconds.

Some embodiments provide that the first material includes one or more phosphors that emit light having a substantially blue color. In some embodiments, the second material includes one or more phosphors that emit light having a substantially yellow color. Some embodiments provide that a third material includes one or more phosphors that emit light having a substantially red color.

Figure 2:
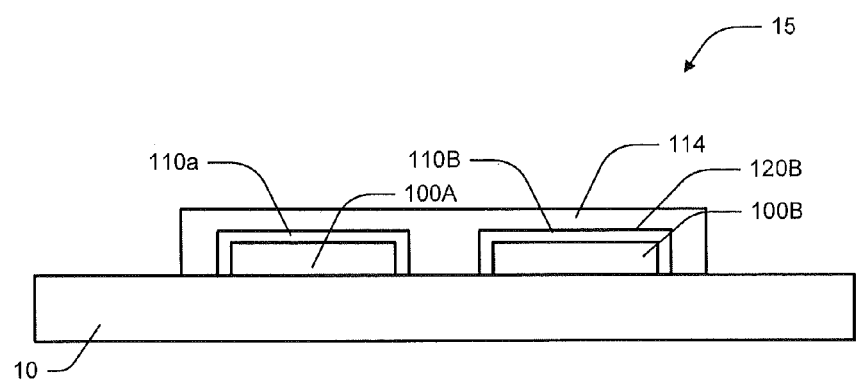
FIG. 2 is a schematic side cross-sectional view of an exemplary light emitting device that includes light emitters including luminescent particles according to some embodiments of the present invention.

Reference is now made to FIG. 2, which is a schematic side cross-sectional view of an exemplary light emitting device that includes light emitters including luminescent particles according to some embodiments of the present invention. A light emitting device 15 may include first and second light emitters 100A, 100B that are configured to emit light therefrom. Some embodiments provide that the emitted light from each of the light emitters 100A, 100B may include light having a first dominant wavelength, such as, for example, a wavelength corresponding to a blue light. In some embodiments, first light emitter 100A may emit light having a different peak wavelength than second light emitter 100B. Although illustrated as including first and second light emitters 100A, 100B, the light emitting device 15 may include more than two light emitters 100A, 100B and/or more than two types of light emitters 100A, 100B. For example, a lighting device 15 may include one or more blue light emitting light emitters, red light emitting light emitters and/or green light emitting light emitters.

The light emitters 100A, 100B may include a light emitting diode, a laser diode and/or other semiconductor device that includes one or more semiconductor layers, which may include silicon, silicon carbide, gallium nitride and/or other semiconductor materials, a substrate which may include sapphire, silicon, silicon carbide and/or other microelectronic substrates, and one or more contact layers, which may include metal and/or other conductive layers. The design and fabrication of semiconductor light emitting devices are well known to those having skill in the art and need not be described in detail herein.

The light emitting device 15 may include luminophoric media 120A, 120B that are positioned in a transmission path of that light that is emitted from the light emitters 100A, 100B. For example, as discussed above regarding FIG. 1, the light emitters 100A, 100B may be coated or otherwise proximate luminophoric media 120A, 120B that include first and second materials, respectively. The first and second materials may be different luminescent particles 150A, 150B and may include luminescent compounds that are configured to absorb a portion of the light emitted from the light emitters 100A, 100B and to emit light having a different wavelength from the light emitted from the light emitters 100A, 100B. For example, some embodiments provide that the down-converted dominant wavelength corresponds to a yellow color. In this regard, the yellow color light emitted from the luminescent particles 150A, 150B combined with the blue light from the light emitter 100A, 100B may appear as white light. The first luminescent particles 150A may have a different decay time than the second luminescent particles 150B.

As discussed above, some embodiments of the luminescent particles 150A, 150B include a phosphor that may be configured to down-convert received photons in the blue and/or ultraviolet portions of the visible spectrum into photons in longer wavelength portions of the visible spectrum. In some embodiments, the first and/or second luminescent particles 150A, 150B may include a red nitride that is a phosphor composition that absorbs in the blue portion of the visible spectrum and emits in the red portion of the visible spectrum. Some embodiments provide that red emitting luminescent particles 150A, 150B may be combined with yellow emitting luminescent particles 150A, 150B. The light emitted from the yellow emitting luminescent particles 150A, 150B and red emitting luminescent particles 150A, 150B may combine with blue light to produce a warm white light. As is known, varying the amount of red emitting luminescent particles 150A, 150B may vary the warmth of the white light. In this regard, a yellow to red weight percent ratio may be determined to yield a particular color point, as may be defined in a mathematically defined color space. For example, in some embodiments, the warm white light may correspond to CIE 1931 E7 or E8 bins, among others. As such, the yellow emitting luminescent particles 150A, 150B may include first yellow emitting luminescent particles 150A and second yellow luminescent particles that have different decay times from one another and first red emitting luminescent particles 150A and second red emitting luminescent particles 150B may have different decay times from one another.

The luminescent compound may include a host compound material including, for example, any of $Ca_{1-x}Sr_xAlSiN_3$, $Ca_2Si_5N_8$, $Sr_2Si_5N_8$, $Ba_2Si_5N_8$, $BaSi_7N_{10}$, $BaYSi_4N_7$, $Y_5(SiO_4)_3N$, $Y_4Si_2O_7N_2$, $YSiO_2N$, $Y_2Si_3O_3N_4$, $Y_2Si_{3-x}Al_xO_3+xN_4-x$, $Ca_{1.5}Si_9Al_3N_{16}$, $Y_{0.5}Si_9Al_3O_{1.5}N_{14.5}$, $CaSiN_2$, $Y_2Si_4N_6C$, and/or $Y_6Si_{11}N_{20}O$, among others. The luminescent compound may further include an activator material that is combined with the host compound material. The activator material may include, for example, any of Ce, Eu, Sm, Yb, Gd and/or Tb, among others.

Although not illustrated, the light emitting device 15 may include multiple different solid state light emitters 100 each including different luminescent materials. For example, luminescent materials on a pair of emitters 100 may emit light having substantially the same dominant wavelength but having different decay times and luminescent materials on another pair of light emitters may emit light having substantially the same dominant wavelength as each other, but different from the other pair of light emitters 100 and have different decay times.

Additionally, the light emitters 100 on the substrate 10 may be provided with a lens 114 using, for example, a molded encapsulant material. In some embodiments according to the invention, the encapsulant material may be formed in one or more layers and may provide additional optical features to the lighting device 15. Subsequent to molding the lenses 114, additional discrete electronic component packages may be mounted on the substrate 10. For example, in some embodiments according to the invention, the discrete electronic component packages making up an LED driver circuit can be mounted on to the substrate 10 after the lenses 114 are formed from the encapsulant material.

Figure 3A:
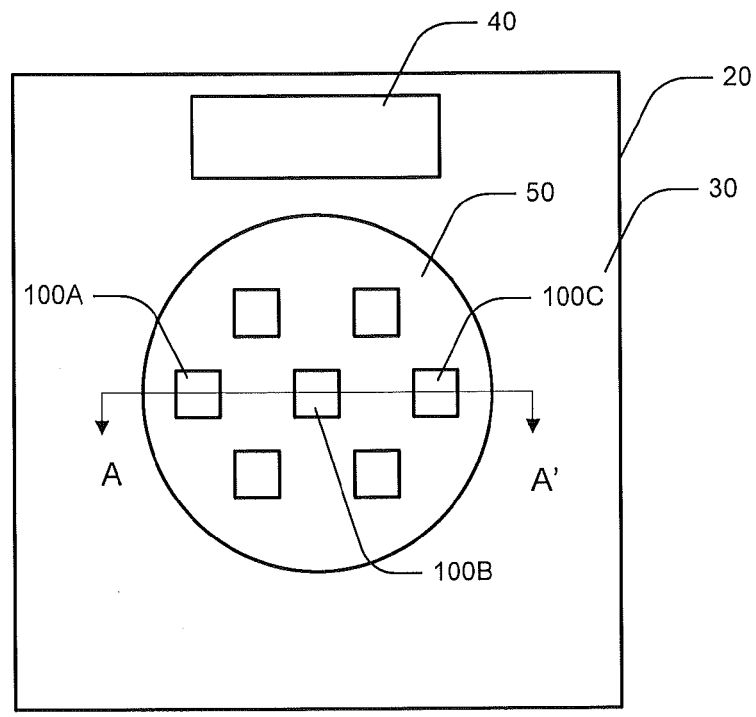
FIG. 3A is a schematic plan view illustrating a solid state lighting apparatus according to some embodiments of the present invention.
Figure 3B:
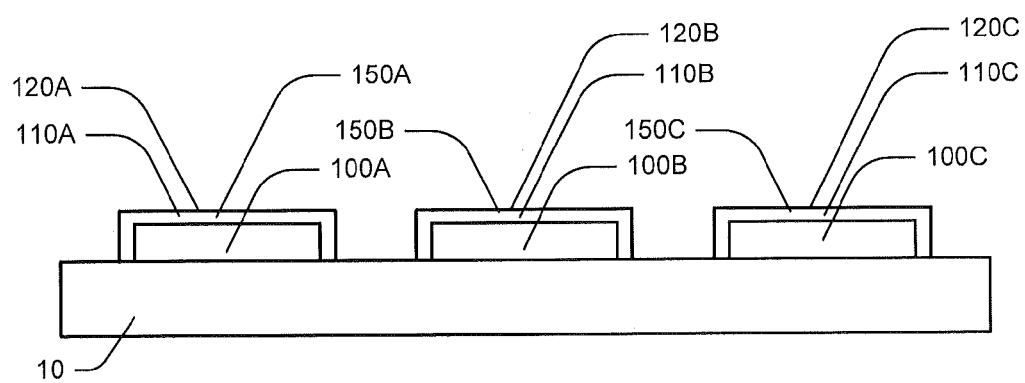
FIG. 3B is a schematic cross-sectional view taken along lines A-A' of FIG. 3A according to some embodiments of the present invention.

Reference is now made to FIGS. 3A and 3B. FIG. 3A is a plan view illustrating the solid state lighting apparatus 20 including the substrate 30 including an LED driver circuit 40 and an LED circuit 50 mounted on the surface thereof in some embodiments according to the invention. FIG. 3B is a cross-sectional view of a portion of the solid state lighting apparatus 20 shown in FIG. 3A in some embodiments according to the invention.

According to FIG. 3A, in some embodiments according to the invention, the substrate 30 can be a printed circuit board (PCB). The PCB can be formed of many different materials that can be arranged to provide the desired electrical isolation and high thermal conductivity. In some embodiments, the PCB can at least partially comprise a dielectric to provide the desired electrical isolation. In other embodiments according to the invention, the PCB can comprise ceramic such as alumina, aluminum nitride, silicon carbide, or a polymeric material such as polyimide and polyester etc.

For boards made of materials such a polyimides and polyesters, the boards can be flexible (sometimes referred to as a flexible printed circuit board). This can allow the board to take a non-planar or curved shape, with the light emitters 100A-C (also referred to herein as LED chips) also being arranged in a non-planar manner. In some embodiments according to the invention, the board can be a flexible printed substrate such as a Kapton® polyimide available from Dupont. In some embodiments according to the invention, the board can be a standard FR-4 PCB.

This can assist in providing boards that emit the different light patterns, with the non-planar shape allowing for a less directional emission pattern. In some embodiments according to the invention, this arrangement can allow for more omnidirectional emission, such as in the 0-180° emission angles. In some embodiments according to the invention, the PCB can comprise highly reflective material, such as reflective ceramic or metal layers like silver, to enhance light extraction from the component.

In some embodiments, the board can include a dielectric layer to provide electrical isolation, while also comprising electrically neutral materials that provide good thermal conductivity. Different dielectric materials can be used for the dielectric layer including epoxy based dielectrics, with different electrically neutral, thermally conductive materials dispersed within it. Many different materials can be used, including but not limited to alumina, aluminum nitride (AlN) boron nitride, diamond, etc. Different dielectric layers according to the present invention can provide different levels of electrical isolation with some embodiments providing electrical isolation to breakdown in the range of 100 to 5000 volts. In some embodiments, the dielectric layer can provide electrical isolation in the range of 1000 to 3000 volts. In still other embodiments, the dielectric layer can provide electrical isolation of approximately 2000 volts breakdown. In some embodiments according to the invention, the dielectric layer can provide different levels of thermal conductivity, with some having a thermal conductivity in the range of 1-40 W/mK. In some embodiments, the dielectric layer can have a thermal conductivity greater than 10 w/mK. In still other embodiments, the dielectric layer can have a thermal conductivity of approximately 3.5 W/m-K.

The dielectric layer can have many different thicknesses to provide the desired electrical isolation and thermal conductivity characteristics, such as in the range of 10 to 100 micro meters ($\mu$m). In other embodiments, the dielectric layer can have a thickness in the range of 20 to 50 ($\mu$m). In still other embodiments, the dielectric layer can have a thickness of approximately 35 ($\mu$m).

In some embodiments according to the invention, the substrate 30 can be a metal core PCB, such as a "Thermal-Clad" (T-Clad) insulated substrate material, available from The Bergquist Company of Chanhassen, Minn. The "Thermal Clad" substrate may reduce thermal impedance and conduct heat more efficiently than standard circuit boards. The MCPCB can also include a base plate on the dielectric layer, opposite the LED string circuit 50, and can comprise a thermally conductive material to assist in heat spreading. The base plate can comprise different material such as copper, aluminum or aluminum nitride. The base plate can have different thicknesses, such an in the range of 100 to 2000 $\mu$m, while other embodiments can have a thickness in the range of 200 to 1000 $\mu$m. Some embodiments can have thickness of approximately 500 $\mu$m.

Such substrates may be mechanically robust compared to thick-film ceramics and direct bond copper arrangements. Accordingly, the metal core printed circuit board can be effective to transfer heat generated by LEDs included in the LED string circuit 50 away from the solid state lighting apparatus 20. It will be understood, however, that the substrate 30 can be any material which is suitable for the mounting of the LED driver circuit 40 and LED string circuit 50 thereon, which provides for sufficient thermal conduction away from the LED string circuit 50.

In some embodiments, the MCPCB includes a solder mounting layer on the bottom surface of the base plate that is made of materials that make it compatible for mounting directly to a heat sink, such as by solder reflow. These materials can comprise one or more layers of different metals such as nickel, silver, gold, palladium. In some embodiments, the mounting layer can include a layer of nickel and silver, such a nickel having thickness in the range of 2 to 3 $\mu$m and silver in the range of 0.1 to 1.0 $\mu$m. In some embodiments, the mounting layer can include other layer stacks such as electroless nickel of approximately 5 $\mu$m, electroless palladium of approximately 0.25 $\mu$m, and immersion gold of approximately 0.15 $\mu$m. Direct soldering of the MCPCB to a heat sink can enhance thermal spreading of heat from the board to the heat sink by providing an increased thermal contact area between the two. This can enhance both vertical and horizontal heat transfer. In some embodiments according to the invention, the MCPCBs can provide different levels of thermal characteristics with a junction to backside performance of approximately of approximately 0.4° C./W.

The size of the substrate 30 can vary depending on different factors, such as the size and number of the chip-on-board LED mounted thereon. For example, in some embodiments the substrate can be approximately 33 mm on each side. In some embodiments according to the invention, the components on the substrate can present a height of about 2.5 mm. Other dimensions can also be used for the substrate 30.

It will be understood that the substrate 30 can be utilized in combination with heat sink structures mounted to, or incorporated within, the respective substrate to provide sufficient heat transfer away from the solid state lighting apparatus 20. In some embodiments according to the invention, a flexible heat transfer tape, such as GRAFIHX™, available from GraphTech, International of Lakewood, Ohio, can be used to attach a heat sink to the substrate 30. The heat sink can be any thermally efficient material sufficient to conduct heat away from the substrate 30. For example, the heat sink can be a metal, such as aluminum. In some embodiments according to the invention, the heat sink is graphite. In some embodiments according to the invention, the heat sink includes reflective surfaces to improve light extraction.

As further shown in FIG. 3A, the solid state lighting apparatus 20 includes the LED driver circuit 40 mounted on the surface thereof along with a plurality of chip-on-board LEDs 100A-C arranged into a plurality of LED sets coupled in series with one another to provide the LED string circuit 50 (sometimes referred to as an array of COB LEDs). In some embodiments according to the invention, the COB LEDs of the LED string circuit 50 can be arranged according to a particular pattern in approximately the center of the substrate 30. It will be understood, however, that the COB LEDs can be arranged in any way that is suitable to provide the light output desired from the solid state lighting apparatus 20. For example, the COB LEDs can be arranged in an approximately circular array, a rectangular array, a random array, or a semi-random array. In some embodiments according to the invention, COB LEDs can be mounted onto a single circuitized substrate 30 with the "dead-space" between the COB LEDs being reduced, which may reduce the size of the solid state lighting apparatus 20 or the size allocated to the substrate 30 within the apparatus 20.

In a COB implementation, a microchip or die, such as an LED, is mounted on and electrically interconnected to its final circuit substrate, instead of undergoing traditional assembly or packaging as an individual LED package or integrated circuit. The elimination of conventional device packaging when using COB assemblies can simplify the over-all process of designing and manufacturing, can reduce space requirements, can reduce cost, and can improve performance as a result of the shorter interconnection paths. A COB process can include three primary steps: 1) LED die attach or die mount; 2) wire bonding; and 3) encapsulation of the die and wires. These COB arrangements can also provide the added advantage of allowing for direct mounting and interface with the main apparatus heat sink.

In some embodiments LED array embodiments, each light emitter 100A-C in the array can have its own lens formed onto it to facilitate light extraction and emission with the first pass. First pass light extraction/emission refers to light emitted from a particular LED chip passing through the respective lens and the light's first pass from the LED chip to the surface of the primary lens. First pass emission means that the light is not reflected back, such as by total internal reflection (TIR), where some of the light can be absorbed. This first pass emission can enhance the emission efficiency of the LED components by reducing LED light that can be absorbed. Some embodiments can provide a high density of light emitting components while maximizing the light extraction, which can increase the efficiency of the respective solid state lighting apparatus. Some embodiments according to the present invention can be arranged in sub-groups of LED chips within the array, with each sub-group having its own primary lens for improved light extraction. In some embodiments, the lens can be hemispheric, which can further increase light extraction by providing a lens surface that promotes fist pass light emission.

In some embodiments according to the present invention, LED arrays can include light emitters 100A-C that emit light of the same color or of different colors (e.g. red, green and blue LED chips or subgroups, white LED and red LED chips or subgroups, etc.) Techniques for generating white light from a plurality of discrete light sources to provide desired CRI at the desired color temperature have been developed that utilize different hues from different discrete light sources. Such techniques are described in U.S. Pat. No. 7,213,940, entitled "Lighting Device and Lighting Method", which is hereby incorporated herein by reference.

Additionally, each of the light emitters 100A-C may include corresponding luminophoric media 120A-C that includes luminescent particles 110A-C. As discussed above regarding FIG. 2, the different ones of light emitters 100A-C may, in cooperation with their respective luminophoric media 120A-C may be configured to emit light including the same and/or different peak dominant wavelengths of light. Additionally, different ones of the luminescent particles 110A-C may be operable to have different decay times. For example, different luminescent particles emitting light having substantially the same dominant wavelength may have different decay times. Some embodiments provide that different ones luminescent particles 110A-C emitting light having different dominant wavelengths may have similar and/or substantially the same decay times. Additionally, different ones of the luminescent particles 110A-C may be used in combination with a single or multiple ones of the light emitters 100A-C. For example, a light emitter 100A that is configured to be driven at a shorter duty cycle may include luminescent particles 110A-C that emit light having different dominant wavelengths of light but have shorter decay times that luminescent particles 110A-C that may be used with a light emitter 100B that is configured to be driven at a longer duty cycle.

In some embodiments, a secondary lens or optic may be used in addition to the primary lens or optics, e.g. a larger secondary optic over multiple groups of emitters with primary optics. With each emitter or groups of emitters having their own primary lens or optic, embodiments according to the invention, may exhibit greater scalability to more readily provide for larger arrays of LEDs. In some embodiments according to the present invention, the LED string circuit 50 can include hundreds of COB LEDs.

In some embodiments the LED array can be COB mounted to a substrate 30 having characteristics that provide for improved operation. The substrate 30 can provide electrical isolation characteristics, which allows for board level electrical isolation of the COB LEDs. At the same time the board can have properties that provide an efficient thermal path to spread heat from the COB LEDs. Efficient thermal spreading of heat from the COB LEDs can result in improved LED chip reliability and color consistency. The substrate 30 can also be arranged to allow efficient mounting a primary heat sink. In some embodiments according to the invention, the substrate 30 includes features that allow it to be easily and efficiently mounted to the heat sink using mechanical means. In other embodiments, the circuit board can comprise a material that allows it to be efficiently and reliably soldered to a heat sink, such as through reflow processes.

Some embodiments of the present invention can provide LED array arrangements that are scalable, such that some embodiments can have as few as three emitters and others can have as many as tens or hundreds of emitters.

It will be further understood that some of the components in the LED driver circuit 40 can be discrete electronic component packages mounted on the substrate 30 to provide, for example, the plurality of current diversion circuits mounted on the surface of the substrate 30. It will be further understood that other electronic component packages can be provided on the substrate 30 to provide the remainder of the circuits included in the solid state lighting apparatus 20.

Although not illustrated, the substrate 30 can be a metal core multi-layered PCB including an upper metal layer used to provide interaction between the electronic component packages on the surface of the substrate 30. A lower metal (or base) layer can be used to promote heat transfer away from the LED string circuit 50 and can be relatively thick compared to the upper metal layer. The upper metal layer and the lower metal layer may be separated by a thermally conductive dielectric layer that can electrically insulate the upper metal layer from the lower metal layer while still providing a thermal path from the LED string array 50 to the lower metal layer.

Accordingly, the lower metal layer can provide a heat sink for the transfer of heat away from the LED string circuit 50. In still further embodiments according to the invention, a secondary heat sink can be attached to a lower surface of the lower metal layer to provide for additional heat transfer away from the LED string circuit 50.

In some embodiments according to the invention, the lower metal layer can be a metal such as aluminum, copper, or beryllium oxide. In some embodiments according to the invention, the thermally conductive dielectric layer can be a filler-matrix composite that acts as a bonding medium as well as a thermal path for heat conduction as well as providing an insulating layer between the upper metal layer and the lower metal layer. In some embodiments according to the invention, the thermal conductivity of the thermally conductive dielectric layer can be about 4 to about 16 times greater than conventional FR4 dielectrics.

Although a single (i.e. upper) metal layer described above, other embodiments according to the invention, can be provided where additional signal layers are provided as part of the metal core PCB. For example, in some embodiments according to the invention, additional upper metal layers can be provided within a thicker thermally conductive dielectric layer to provide a two or more layer multi-core printed circuit board in some embodiments according to the invention. In still further embodiments according to the invention, additional thermally conductive dielectric layers can be provided beneath the lower metal layer such that the lower metal layer is within the metal core printed circuit board, rather than on an exposed surface thereof.

Figure 4:
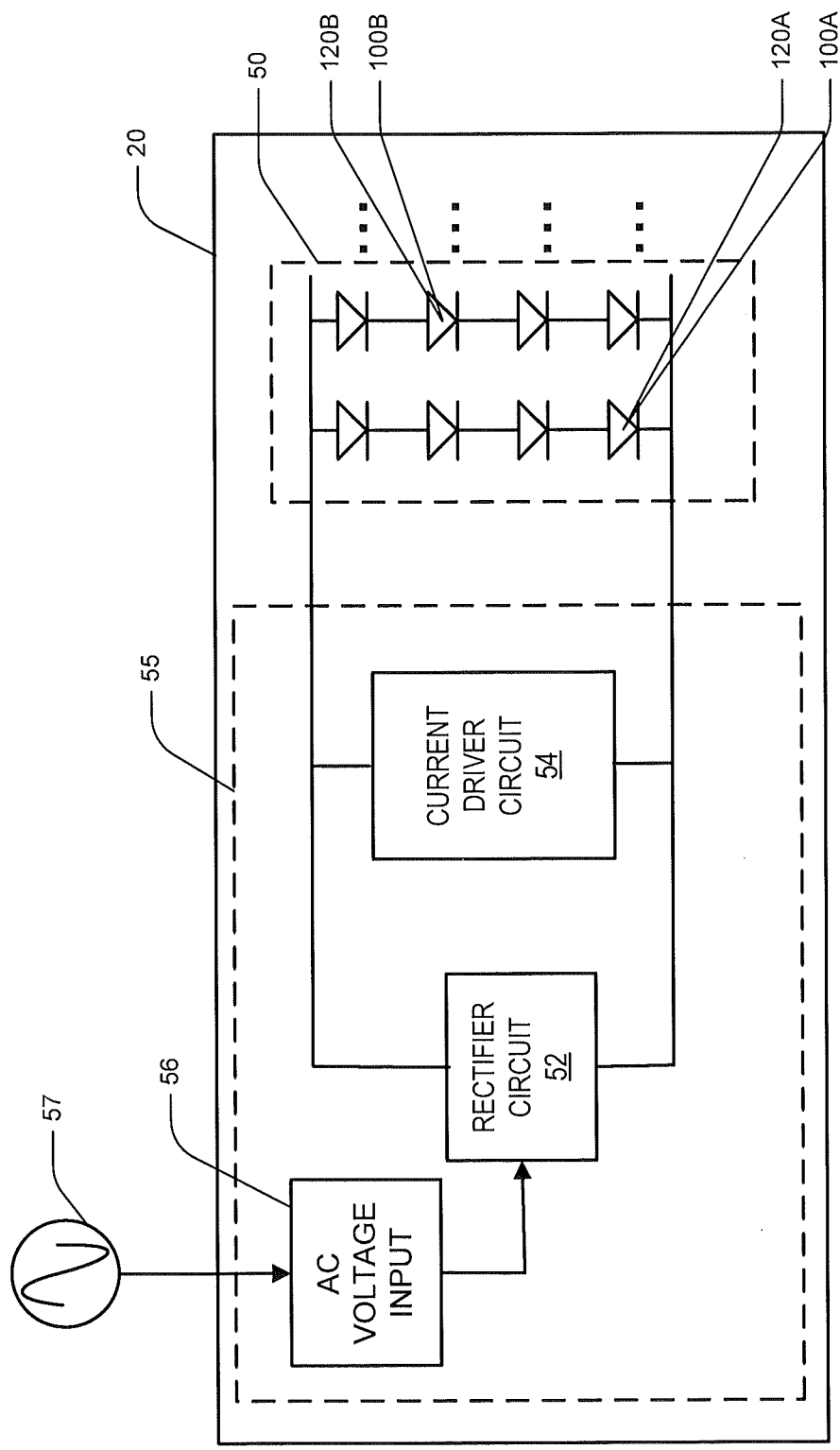
FIG. 4, which is a schematic block diagram illustrating a solid state lighting device according to some embodiments of the present invention.

Reference is now made to FIG. 4, which is a schematic block diagram illustrating a solid state lighting device according to some embodiments of the present invention. According to FIG. 4, the LED driver circuit 40 may include a rectifier circuit 52 coupled to a current driver circuit 54 and to the LED string circuit 50 that includes a plurality of LED string sets of light emitters 120A-C coupled in series with one another. The rectifier circuit 52 may be coupled to an alternating current (AC) voltage input 56, which is configured to receive an AC voltage signal 57. In some embodiments, the current driver circuit 54 may coupled to selected nodes between ones of the LED sets in the LED string circuit 50.

The current driver circuit 54 can be configured to drive different ones of the LED string sets at different duty cycles to achieve a color point and/or luminance based on the combined emissions of the light emitters 100A-C and corresponding luminophoric media 120A-C. The current driver circuit 54 can include transistors that are configured to provide respective controllable current to the LED string sets. These transistors may be turned on/off by the biasing transitions of the LED sets which may be used to affect the biasing of the transistors.

As further shown in FIG. 4, the rectifier circuit 52, the current driver circuit 54, and the LED string circuit 50 can be mounted on the substrate 30 such that each of these components is provided on a single surface of the substrate 30. In other embodiments according to the invention, some of the circuits described herein are mounted on a first side of the substrate 30, whereas the remaining circuits are mounted on the opposing side of the substrate 30. In some embodiments according to the invention, however, the circuits described herein are mounted on the substrate 30 without the use of intervening substrates, sub-mounts, carriers, or other types of surfaces which are sometimes used to provide stacked types of assemblies in conventional arrangements.

In some embodiments according to the invention, at least some of the components described in reference to FIG. 4 can be mounted on the substrate 30 as discrete electronic component packages. Still further, in some embodiments according to the invention, some of the remaining circuits described in reference to FIG. 4 can be integrated into a single integrated circuit package mounted on the substrate 30.

Figure 5:
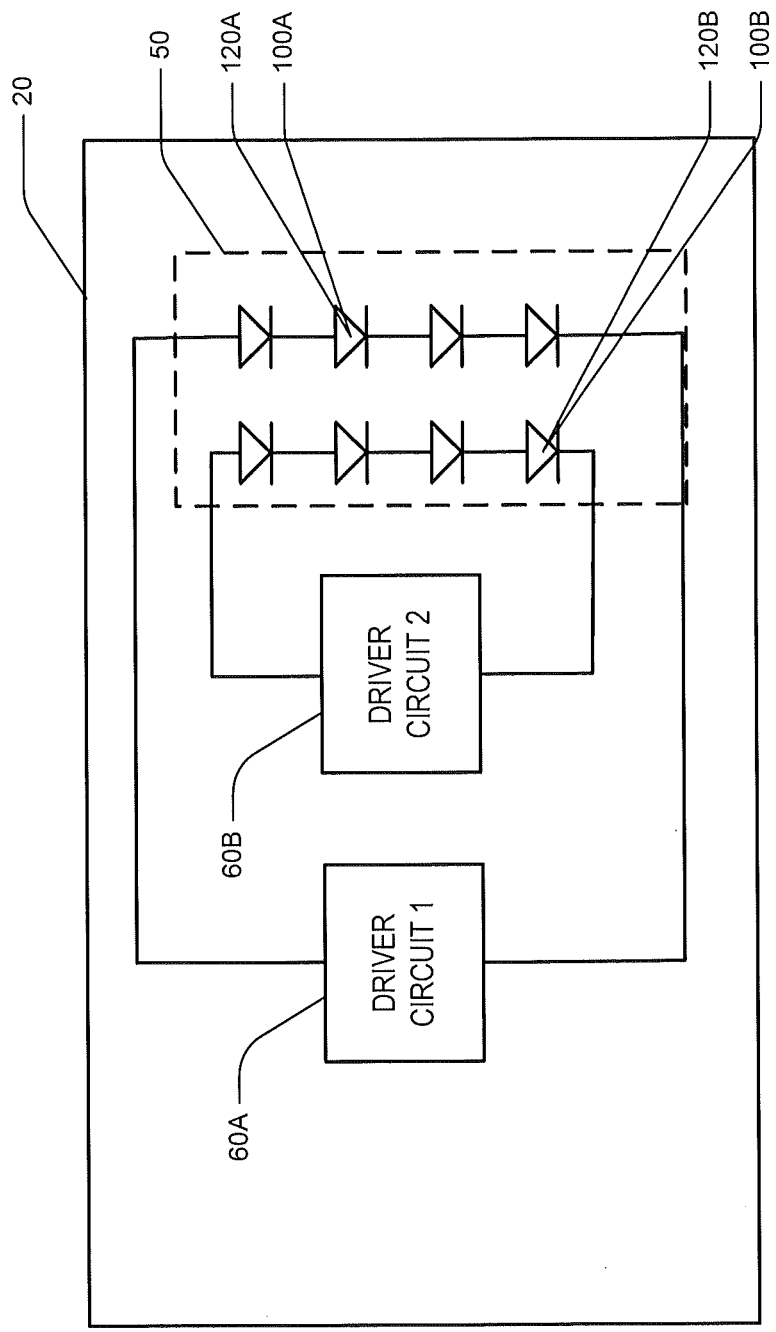
FIG. 5 is a schematic block diagram illustrating a solid state lighting device according to some embodiments of the present invention.

Reference is now made to FIG. 5, which is a schematic block diagram illustrating a solid state lighting device according to some embodiments of the present invention. In some embodiments, a solid state lighting apparatus 20 may include an LED string circuit 50 that includes one or more strings of light emitters 100A, 100B that include corresponding luminophoric media 120A, 120B.

A first driver circuit 60A may be operable to provide current to a first string of the light emitters 100A at a first duty cycle that defines a ratio of on-state time to off-state time. A second driver circuit 60B may be operable to provide current to a second string of light emitters 100B at a second duty cycle that is different than the first duty cycle. A first luminophoric medium 120A may be positioned and operable to receive and down-convert radiation from light emitters 100A in the first string. A second luminophoric medium 120B may be positioned and operable to receive and down-convert radiation from light emitters 100BA in the second string.

The first luminophoric medium 120A may have a first decay time and the second luminophoric medium 120B may have a second decay time that is different from the first decay time. In some embodiments, a ratio of the first decay time to the second decay time is positively correlated with a ratio of the first duty cycle to the second duty cycle. For example, some embodiments provide that the first duty cycle is less than the second duty cycle and that the first decay time is less than the second decay time.

In some embodiments, the first and second light emitters 100A, 100B and luminophoric media 120A, 120B are configured to emit light having substantially the same dominant peak wavelength. Some embodiments provide that the first and/or second peak wavelengths are in a range of about 535 nm to about 565 nm. In some embodiments, the first and/or second peak wavelengths are in a range of about 535 nm to about 545 nm. Some embodiments provide that the first and/or second peak wavelengths are in a range of about 545 nm to about 565 nm. In some embodiments, the first and/or second peak wavelengths are in a range of about 630 nm to about 650 nm.

According to some embodiments, the first decay time is in a range of about 0.08 μseconds to about 0.12 μseconds. In some embodiments, the second decay time is in a range of about 0.18 μseconds to about 0.22 μseconds. Some embodiments provide that the first decay time is in a range of about 18 μseconds to about 22 μseconds. In some embodiments, the second decay time is in a range of about 28 μseconds to about 32 μseconds.

Although not illustrated in FIG. 5, the solid state lighting apparatus 20 may include an AC voltage source input (57, FIG. 4) and a rectifier circuit (52, FIG. 4) coupled to the AC voltage source input to provide a rectified voltage to the first driver circuit 60A and the second driver circuit 60B.

It will be understood that the AC voltage signal can have any magnitude that is sufficient to operate the apparatus 20 in some embodiments according to the invention. For example, in some embodiments according to the invention, the AC voltage signal can be 24 volts AC, 48 volts AC, 90 volts AC, 110 volts AC, 220 volts AC, 230 volts AC, 277 volts AC, or any intermediate voltage. In some embodiments according to the invention, the AC voltage signal is provided from a single phase AC voltage signal. In some embodiments according to the invention, however, the AC voltage signal can provided via voltage signals from two leads of a three phase AC voltage signal. Accordingly, the AC voltage signal can be provided from higher voltage AC voltage signals, regardless of the phase. For example, in some embodiments according to the invention, the AC voltage signal can be provided from a three phase 600 volt AC signal. In still further embodiments according to the invention, the AC voltage signal can be a relatively low voltage signal, such as 12 volts ac.

Figure 6A:
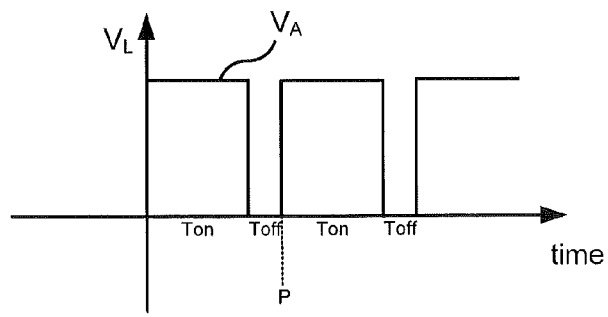
FIGS. 6A and 6B are graphs that plot voltages applied to emitters driven at different duty cycles according to some embodiments of the present invention.
Figure 6B:
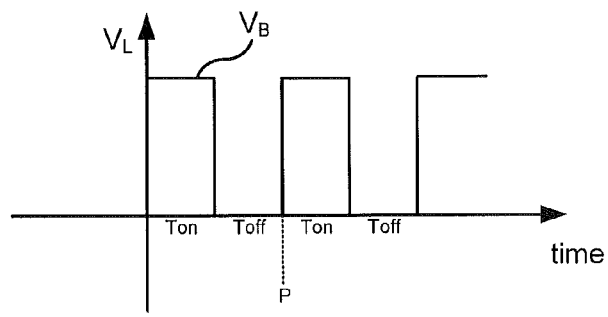

Brief reference is now made to FIGS. 6A and 6B, which are graphs that plot voltages applied to emitters driven at different duty cycles according to some embodiments of the present invention. The illustrated graphs are for example only and thus are simplified using linear plots, however, other voltage profiles including voltage characteristics corresponding to transistor transition properties, capacitances, and inductances in corresponding circuits are contemplated herein. Referring to FIG. 6A, the voltage applied to light emitter 100A corresponds to a duty cycle in which the emitter is in an on state for more than half of the time period P. In contrast, referring to FIG. 6B, the voltage applied to light emitter 100B corresponds to a duty cycle in which the emitter is in an on state for about half of the same period P. Note, that the period P is illustrated in the examples of FIGS. 6A and 6B as being the same. However, light emitters having duty cycles and corresponding to different frequencies and/or periods is contemplated herein.

Figure 6C:
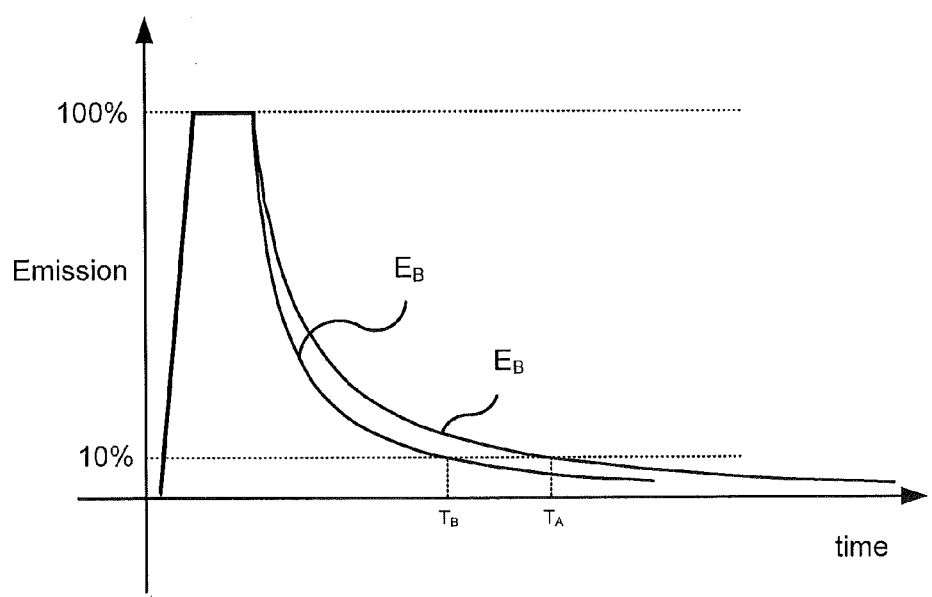
FIG. 6C is an example of decay curve of two different luminophoric media corresponding to light emitters discussed above in relation to FIGS. 6A and 6B according to some embodiments disclosed herein.

Brief reference is made to FIG. 6C, which is an example of decay curve of two different luminophoric media corresponding to light emitters discussed above in relation to FIGS. 6A and 6B according to some embodiments disclosed herein. While the decay time may be used to refer to the time from a full and/or steady state emission level to a zero emission level, a non-zero threshold emission may be used. For example, as illustrated, the decay time may be determined to be the time from a 100% emission level to a 10% emission level. As illustrated, a luminophoric medium 120A may have a decay time $T_A$ and a luminophoric medium 120B may have a decay time $T_B$, which is shorter than $T_A$. Different ones of the luminophoric media 120A, 120B may be used depending on the duty cycle at which the corresponding light emitters operate.

Figure 7:
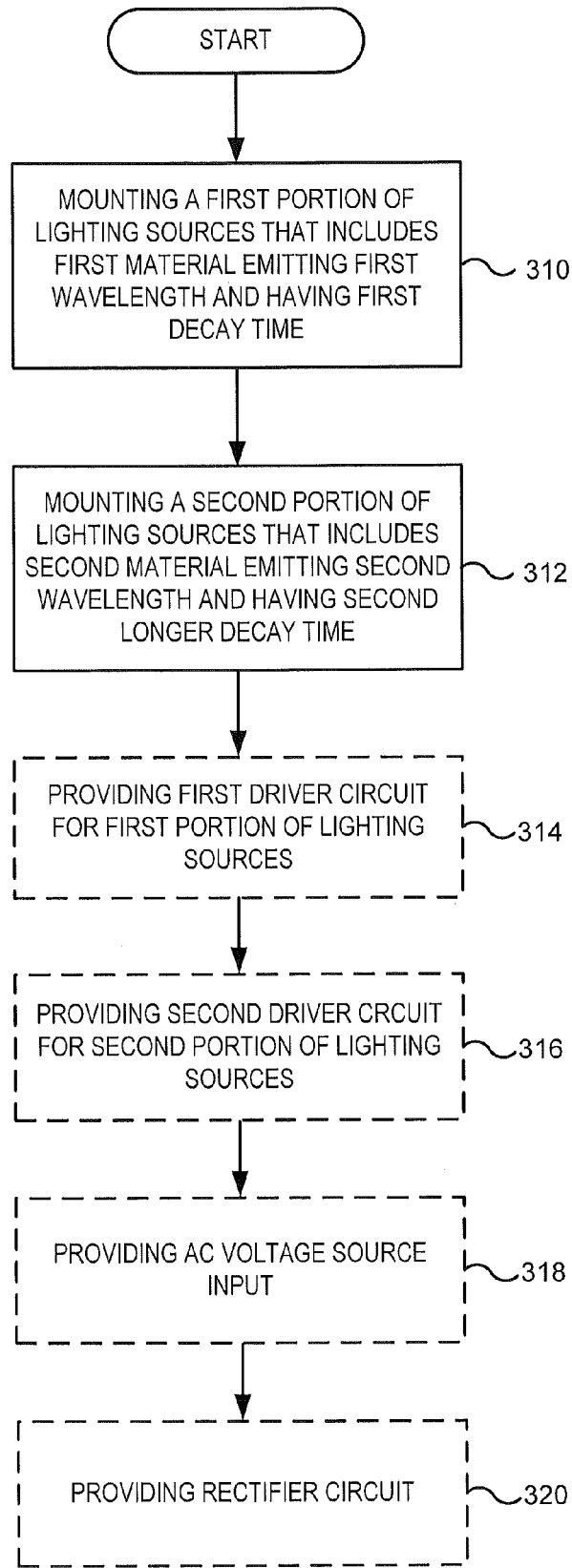
FIG. 7 is a block diagram illustrating operations corresponding to systems and methods for providing a solid state lighting device according to some embodiments of the present invention.

Reference is now made to FIG. 7, which is a block diagram illustrating operations corresponding to systems and methods for providing a solid state lighting device according to some embodiments of the present invention. A first portion multiple solid state lighting sources is mounted to a substrate (block 310). Solid state lighting sources in the first portion include a first luminophoric material that down-converts radiation emitted thereby to radiation having a first peak wavelength that is different from the peak wavelength emitted by the solid state lighting sources. The radiation emitted by the first luminophoric medium may exhibit a first decay time.

A second portion of the solid state lighting sources is mounted to the substrate (block 312). Solid state lighting sources in the second portion include a second luminophoric material that down-converts radiation emitted thereby to radiation having a second peak wavelength that is different from the peak wavelength emitted by the solid state lighting sources. The radiation emitted by the second luminophoric medium may exhibit a second decay time that is longer than the first decay time.

Some embodiments provide that the first decay time is in a range of about 0.08 μseconds to about 0.12 μseconds and the second decay time is in a range of about 0.18 μseconds to about 0.22 μseconds. In some embodiments, the first decay time is in a range of about 18 μseconds to about 22 μseconds and the second decay time is in a range of about 28 μseconds to about 32 μseconds.

In some embodiments, the first and second peak wavelengths are substantially the same. However, some embodiments provide that the first and second peak wavelengths may be different from one another. In some embodiments, the first peak wavelength and/or the second peak wavelength is in a range of about 535 nm to about 565 nm. Some embodiments provide that the first peak wavelength and/or the second peak wavelength is in a range of about 535 nm to about 545 nm. In some embodiments, the first peak wavelength and/or the second peak wavelength is in a range of about 545 nm to about 565 nm. Some embodiments provide that the first peak wavelength and/or the second peak wavelength is in a range of about 630 nm to about 650 nm.

Some embodiments include providing a first driver circuit that is operable to provide current to the first portion of solid state lighting sources (block 314). The current may be provided to the solid state lighting sources at a first duty cycle that defines a ratio of on-state time to off-state time of the first portion of solid state lighting sources. A second driver circuit that is operable to provide current to the second portion of solid state lighting sources may be provided (block 316). The current may be provided to the second portion of solid state lighting sources at a second duty cycle that defines a ratio of on-state time to off-state time of the second solid state lighting sources. The second duty cycle may be different than the first duty cycle. In some embodiments, a ratio of the first decay time to the second decay time is positively correlated with a ratio of the first duty cycle to the second duty cycle. For example, the first duty cycle may be less than the second duty cycle and the first decay time may be less than the second decay time.

In some embodiments an AC voltage source input may be provided from outside the solid state lighting device (block 318). Some embodiments provide that an AC input circuit may be provided to receive the AC voltage source input from outside the solid state lighting device. A rectifier circuit coupled to the AC voltage source input may be provided (block 320). The rectifier circuit may provide a rectified AC voltage to the first driver circuit and/or the second driver circuit.

Figure 8:
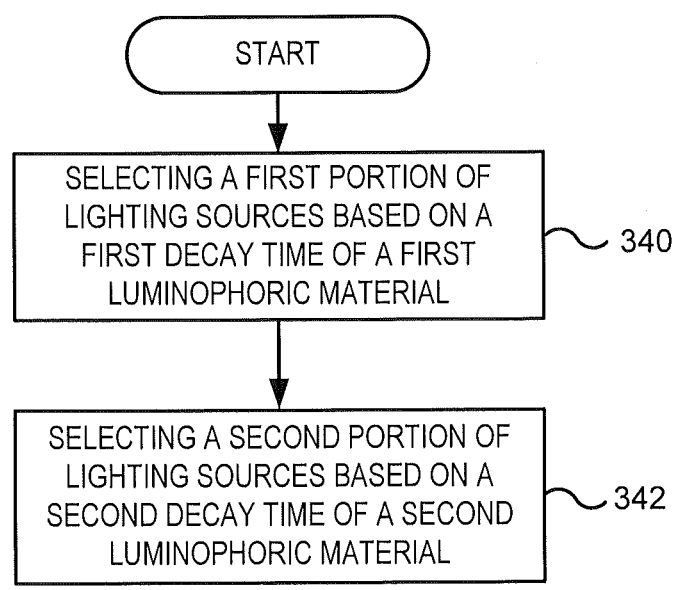
FIG. 8 is a block diagram illustrating operations corresponding to systems and methods for providing a solid state lighting device according to some embodiments of the present invention.

Reference is now made to FIG. 8, which is a block diagram illustrating operations corresponding to systems and methods for providing a solid state lighting device that includes solid state lighting sources according to some embodiments disclosed herein. The solid state lighting sources include a first portion of solid state lighting sources having a first luminophoric material and that are configured to be driven at a first duty cycle and a second portion of solid state lighting sources having a second luminophoric material and that are configured to be driven at a second duty cycle that is different from the first duty cycle. The first portion of solid state lighting sources may be selected based on a first decay time of the first luminophoric material (block 340). The second portion of solid state lighting sources may be selected based on a second decay time of the second luminophoric material (block 342).

In some embodiments, the second decay time is longer than the first decay time and the second duty cycle is greater than the first duty cycle. Some embodiments provide that a ratio of the first duty cycle to the first decay time corresponds to a given percentage of a ratio of the second duty cycle to the second decay time. In some embodiments, the given percentage is in a range of about 50 percent to about 150 percent. Some embodiments provide that the given percentage is in a range of about 80 percent to about 120 percent. In some embodiments, the given percentage is in a range of about 90 percent to about 110 percent.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present inventive subject matter. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It will be understood that when an element or layer is referred to as being "on" another element or layer, the element or layer can be directly on another element or layer or intervening elements or layers may also be present. In contrast, when an element is referred to as being "directly on" another element or layer, there are no intervening elements or layers present. As used herein, the term "and/or" includes any and all combinations of one or more of the associated listed items.

Spatially relative terms, such as "below", "beneath", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation, in addition to the orientation depicted in the figures. Throughout the specification, like reference numerals in the drawings denote like elements.

Embodiments of the inventive subject matter are, described herein with reference to plan and perspective illustrations that are schematic illustrations of idealized embodiments of the inventive subject matter. As such, variations from the shapes of the illustrations as a result, for example, of manufacturing techniques and/or tolerances, are to be expected. Thus, the inventive subject matter should not be construed as limited to the particular shapes of objects illustrated herein, but should include deviations in shapes that result, for example, from manufacturing. Thus, the objects illustrated in the figures are schematic in nature and their shapes are not intended to illustrate the actual shape of a region of a device and are not intended to limit the scope of the inventive subject matter.

The terminology used herein is for the purpose of describing particular embodiments only and is not intended to be limiting of the present inventive subject matter. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this present inventive subject matter belongs. It will be further understood that terms used herein should be interpreted as having a meaning that is consistent with their meaning in the context of this specification and the relevant art and will not be interpreted in an idealized or overly formal sense unless expressly so defined herein. The term "plurality" is used herein to refer to two or more of the referenced item.

It will be understood that, as used herein, the term light emitting diode may include a light emitting diode, laser diode and/or other semiconductor device which includes one or more semiconductor layers, which may include silicon, silicon carbide, gallium nitride and/or other semiconductor materials, a substrate which may include sapphire, silicon, silicon carbide and/or other microelectronic substrates, and one or more contact layers which may include metal and/or other conductive layers.

In the drawings and specification, there have been disclosed typical preferred embodiments of the inventive subject matter and, although specific terms are employed, they are used in a generic and descriptive sense only and not for purposes of limitation, the scope of the inventive subject matter being set forth in the following claims.

What is claimed is:

1. A light emitting device, comprising:
a solid state lighting source; and
a luminophoric medium for down-converting at least some of the radiation emitted by the solid state lighting source, the luminophoric medium including:
   a first material that down-converts the radiation emitted by the solid state lighting source to radiation having a first peak wavelength and that has a first decay time; and
   a second material that down-converts the radiation emitted by the solid state lighting source to radiation having a second peak wavelength and that has a second decay time that is longer than the first decay time.

2. The light emitting device according to claim 1, wherein the first peak wavelength is substantially the same as the second peak wavelength.

3. The light emitting device according to claim 1, wherein the first peak wavelength is different than the second peak wavelength.

4. The light emitting device according to claim 1,
wherein the solid state lighting source comprises a first solid state lighting source, the device further comprising a second solid state lighting source,
wherein the first material down-converts radiation from the first solid state lighting source, and
wherein the second material down-converts radiation from the second solid state lighting source.

5. The light emitting device according to claim 4, wherein the first peak wavelength is substantially the same as the second peak wavelength.

6. The light emitting device according to claim 4, wherein the first peak wavelength is different that the second peak wavelength.

7. The light emitting device according to claim 1, wherein the solid state lighting source comprises a first solid state lighting source, the device further comprising:
a second solid state lighting source;
a third solid state lighting source; and
a fourth solid state lighting source,
wherein the first material down-converts radiation from the first solid state lighting source,
wherein the second material down-converts radiation from the second solid state lighting source,
wherein the luminophoric medium includes:
   a third material that down-converts radiation emitted by the third solid state lighting source to radiation having a third peak wavelength and that has a third decay time; and
   a fourth material that down-converts radiation emitted by the fourth solid state lighting source to radiation having a fourth peak wavelength and that has a fourth decay time.

8. The light emitting device according to claim 7,
wherein the first wavelength is substantially the same as the second wavelength,
wherein the third wavelength is substantially the same as the fourth wavelength,
wherein the first decay time is different that the second decay time, and
wherein the third decay time is different that the fourth decay time.

9. The light emitting device according to claim 7,
wherein the first wavelength is substantially the same as the second wavelength,
wherein the third wavelength is substantially the same as the fourth wavelength, wherein the first decay time is different that the second decay time, and wherein the third decay time is substantially the same as the fourth decay time.

10. The light emitting device according to claim 1, wherein the solid state lighting source comprises a first solid state lighting source, the device further comprising:
a second solid state lighting source;
a first driver circuit that is operable to provide current to the first solid state lighting source at a first duty cycle that defines a ratio of on-state time to off-state time of the first solid state lighting source; and
a second driver circuit that is operable to provide current to the second solid state lighting source at a second duty cycle that defines a ratio of on-state time to off-state time of the second solid state lighting source,
wherein the first material down-converts radiation from the first solid state lighting source, and
wherein the second material down-converts radiation from the second solid state lighting source.

11. The solid state lighting device according to claim 10, wherein a ratio of the first decay time to the second decay time is positively correlated with a ratio of the first duty cycle to the second duty cycle.

12. The solid state lighting device according to claim 10, wherein the first duty cycle is less than the second duty cycle, and
wherein the first decay time is less than the second decay time.

13. The solid state lighting device according to claim 1, wherein the first peak wavelength and/or the second peak wavelength is in a range of about 535 nm to about 565 nm.

14. The solid state lighting device according to claim 1, wherein the first peak wavelength and/or the second peak wavelength is in a range of about 535 nm to about 545 nm.

15. The solid state lighting device according to claim 1, wherein the second decay time is in a range of about 28 µseconds to about 32 µseconds.

16. The solid state lighting device according to claim 1, wherein the first decay time is greater than about 0.001 seconds.

17. The solid state lighting device according to claim 1, wherein the second decay time is greater than about 0.001 seconds.

18. A method of providing a solid state lighting device, the method comprising:
mounting, to a substrate, a first portion of a plurality of solid state lighting sources that include a first luminophoric material that down-converts radiation emitted by the first portion of the plurality of solid state lighting sources to radiation having a first wavelength and that has a first decay time; and
mounting, to the substrate, a second portion of the plurality of solid state lighting devices having a second luminophoric material that down-converts radiation emitted by the second portion of the plurality of solid state lighting sources to radiation having a second peak wavelength and that has a second decay time that is longer than the first decay time.

19. The method according to claim 18, wherein the first peak wavelength is substantially the same as the second peak wavelength.

20. The method according to claim 18, wherein the first peak wavelength is different than the second peak wavelength.

21. The method according to claim 18, further comprising:
providing a first driver circuit that is operable to provide current to the first portion of the plurality of solid state lighting sources at a first duty cycle that defines a ratio of on-state time to off-state time of the first portion of the plurality of solid state lighting sources; and
providing a second driver circuit that is operable to provide current to the second portion of the plurality of solid state lighting sources at a second duty cycle that defines a ratio of on-state time to off-state time of the second portion of the plurality of solid state lighting sources.

22. The method according to claim 21, wherein a ratio of the first decay time to the second decay time is positively correlated with a ratio of the first duty cycle to the second duty cycle.

23. The method according to claim 21,
wherein the first duty cycle is less than the second duty cycle, and
wherein the first decay time is less than the second decay time.

24. The method according to claim 18, wherein the first peak wavelength and/or the second peak wavelength is in a range of about 630 nm to about 650 nm.

25. The method according to claim 18, wherein the first decay time is in a range of about 0.08 µseconds to about 0.12 µseconds and the second decay time is in a range of about 0.18 µseconds to about 0.22 µseconds.

26. The method according to claim 18, wherein the first decay time is in a range of about 18 µseconds to about 22 µseconds and the second decay time is in a range of about 28 µseconds to about 32 µseconds.

27. The method according to claim 18, wherein the first decay time is greater than about 0.001 seconds.

28. The method according to claim 18, wherein the second decay time is greater than about 0.001 seconds.

29. A method for providing a solid state lighting device that includes a plurality of solid state lighting sources that include a first portion of the plurality of solid state lighting sources including a first luminophoric material that are configured to be driven at a first duty cycle and a second portion of the plurality of solid state lighting sources that include a second luminophoric material that are configured to be driven at a second duty cycle that is different from the first duty cycle, the method comprising:
selecting the first portion of the plurality of solid state lighting sources based on a first decay time of the first luminophoric material; and
selecting the second portion of the plurality of solid state lighting sources based on a second decay time of the second luminophoric material.

30. The method according to claim 29, wherein the first decay time is greater than about 0.001 seconds.

31. The method according to claim 29, wherein the second decay time is greater than about 0.001 seconds.

32. A light emitting device, comprising:
a solid state lighting source that is configured to emit radiation having an emission peak wavelength in a range of about 365 nm to about 420 nm; and
a luminophoric medium for down-converting at least some of the radiation emitted by the solid state lighting source, the luminophoric medium including:

a first material that down-converts the radiation emitted by the solid state lighting source to radiation having a first peak wavelength and that has a first decay time; and a second material that down-converts the radiation emitted by the solid state lighting source to radiation having a second peak wavelength and that has a second decay time, wherein a combined emission corresponding to the first peak wavelength and the second peak wavelength is substantially white light.

33. The device according to claim 32, wherein a visible portion of the combined emission while the solid state lighting source is emitting radiation is substantially the same as the combined emission during the first decay time and second decay time after the solid state lighting source stops emitting radiation.

34. The device according to claim 32,
wherein the solid state light emitting device comprises an LED that is configured to emit radiation having the emission peak wavelength corresponding to ultra-violet light,
wherein the first material comprises a first phosphor and the first peak wavelength is in a range of about 475 nm to about 510 nm, and
wherein the second material comprises a second phosphor and the second peak wavelength is in a range of about 520 nm to about 570 nm.

35. The device according to claim 34, wherein the luminophoric medium for down-converting at least some of the radiation emitted by the solid state lighting source further comprises a third material that down-converts the radiation emitted by the solid state lighting source to radiation having a third peak wavelength that is different from the first wavelength and the second wavelength and that has a third decay time that is substantially the same as the first decay time.

36. The device according to claim 35, wherein the third material comprises a third phosphor and the third peak wavelength is in a range of about 630 nm to about 650 nm.

37. The device according to claim 35, wherein the luminophoric medium comprises layer that is positioned to be in a path of the radiation emitted by the solid state lighting source, and
wherein the first material, the second material and the third material are in the layer.

38. The device according to claim 32, wherein the luminophoric medium comprises:
a first layer that includes the first material;
a second layer that includes the second material; and
a third layer that includes the third material,
wherein the first layer, the second layer and the third layer are positioned to be in a path of the radiation emitted by the solid state lighting source.

39. The device according to claim 32, wherein the first decay time is greater than about 0.001 seconds.

40. The device according to claim 32, wherein the second decay time is greater than about 0.001 seconds.

41. The device according to claim 32,
wherein the first material comprises one or more phosphors that emit light having a substantially blue color, and
wherein the second material comprises one or more phosphors that emit light having a substantially yellow color,
further comprising a third material that down-converts the radiation emitted by the solid state lighting source to radiation having a third peak wavelength and that has a third decay time, the third material comprising one or more phosphors that emit light having a substantially red color.

* * * * *